United States Patent
Tseng et al.

(10) Patent No.: US 7,619,890 B2
(45) Date of Patent: Nov. 17, 2009

(54) HEAT DISSIPATION MODULE

(75) Inventors: Chun-Fa Tseng, Kaohsiung (TW); Chi-Hsueh Yang, Keelung (TW); Yu-Nien Huang, Chung Li (TW)

(73) Assignee: Quanta Computer Inc., Tao Yuan Shien (TW)

( * ) Notice: Subject to any disclaimer, the term of this patent is extended or adjusted under 35 U.S.C. 154(b) by 303 days.

(21) Appl. No.: 11/477,394

(22) Filed: Jun. 30, 2006

(65) Prior Publication Data

US 2007/0247814 A1 Oct. 25, 2007

(30) Foreign Application Priority Data

Apr. 24, 2006 (TW) ............... 95114590 A

(51) Int. Cl.
*H05K 7/20* (2006.01)
(52) U.S. Cl. .............. 361/700; 361/704; 361/719; 165/80.3; 165/104.33; 165/185; 257/718
(58) Field of Classification Search ........ 361/704, 361/710; 165/80.3, 165; 248/74.1; 174/154; 257/E23.084, E23.086, 719

See application file for complete search history.

(56) References Cited

U.S. PATENT DOCUMENTS

| | | | | | |
|---|---|---|---|---|---|
| 3,369,215 | A | * | 2/1968 | Haegert | 439/764 |
| 3,407,382 | A | * | 10/1968 | Haegert | 439/763 |
| 4,802,532 | A | * | 2/1989 | Dawes et al. | 165/80.3 |
| 5,301,907 | A | * | 4/1994 | Julian | 248/74.1 |
| 5,346,782 | A | * | 9/1994 | Julian | 429/65 |
| 5,620,338 | A | * | 4/1997 | Stephens et al. | 439/522 |
| 5,646,826 | A | * | 7/1997 | Katchmar | 361/704 |
| 5,901,039 | A | * | 5/1999 | Dehaine et al. | 361/704 |
| 5,982,622 | A | * | 11/1999 | Chiou | 361/704 |
| 6,097,601 | A | * | 8/2000 | Lee | 361/704 |
| 6,141,220 | A | * | 10/2000 | Lin | 361/704 |
| 6,307,747 | B1 | * | 10/2001 | Farnsworth et al. | 361/704 |
| 6,356,445 | B1 | * | 3/2002 | Mochzuki et al. | 361/697 |
| 6,367,840 | B1 | * | 4/2002 | Duval et al. | 280/777 |
| 6,480,387 | B1 | * | 11/2002 | Lee et al. | 361/704 |
| 6,557,675 | B2 | * | 5/2003 | Iannuzzelli | 188/380 |
| 6,639,800 | B1 | * | 10/2003 | Eyman et al. | 361/704 |
| 6,865,082 | B2 | * | 3/2005 | Huang et al. | 361/700 |
| 6,929,484 | B2 | * | 8/2005 | Weiss et al. | 439/66 |
| 7,019,979 | B2 | * | 3/2006 | Wang et al. | 361/719 |
| 7,277,293 | B2 | * | 10/2007 | Yang et al. | 361/719 |
| 7,283,368 | B2 | * | 10/2007 | Wung et al. | 361/719 |
| 7,292,447 | B2 | * | 11/2007 | Xia et al. | 361/719 |
| 7,342,796 | B2 | * | 3/2008 | Aukzemas | 361/719 |
| 7,375,963 | B2 | * | 5/2008 | Eckberg et al. | 361/704 |
| 2007/0025086 | A1 | * | 2/2007 | Huang et al. | 361/704 |
| 2007/0097649 | A1 | * | 5/2007 | Yang et al. | 361/704 |
| 2007/0217159 | A1 | * | 9/2007 | Long et al. | 361/704 |

\* cited by examiner

*Primary Examiner*—Jayprakash N Gandhi
*Assistant Examiner*—Courtney Smith
(74) *Attorney, Agent, or Firm*—Rabin & Berdo, PC

(57) ABSTRACT

A heat dissipation module includes a heat dissipation device, a resilient bracket and a cylindrically shaped nut. The heat dissipation device is attached to a heat generating component. The cylindrically shaped nut has an arc surface and two circular surfaces. A screw hole is formed on one of the two circular surfaces and an engraved slot is formed on the arc surface. The resilient bracket is secured to the heat dissipation device at an end and has a U-shaped cutout at an opposite end, wherein the U-shaped cutout has a constricted opening for receiving the cylindrically shaped nut. The U-shaped cutout engages with the engraved slot.

4 Claims, 2 Drawing Sheets

HEAT DISSIPATION MODULE

RELATED APPLICATIONS

The present application is based on, and claims priority from, Taiwan Application Serial Number 95114590, filed on Apr. 24, 2006, the disclosure of which is hereby incorporated by reference herein in its entirety.

BACKGROUND

1. Field of Invention

The present invention relates to a heat dissipation module. More particularly, the present invention relates to a heat dissipation module with a fastening structure.

2. Description of Related Art

As notebook PCs become increasingly thinner, there is less and less space for heat convection and heat dissipation design inside the case housing of the notebook PC. When it comes to high-frequency components, such as the CPU (central processing unit) and graphics processing chip, the heat dissipation design hits a bottleneck. Thus, the mainstream framework of the heat dissipation design is forced heat convection via a centrifugal fan.

In conventional practice, a heat dissipation module has its heat sink or fin in contact with a heat generating component with a spring or a resilient bracket to press the heat sink or fin towards the heat generating component. Therefore, heat conduction between the heat sink or fin and the heat generating component can be enhanced so as to dissipate heat out of a PC system.

FIG. 1 illustrates a cross-sectional view of a conventional heat dissipation module 100. A printed circuit board 102 is secured on a notebook PC housing 101. A heat generating component 104 and a nut 112 are soldered on the printed circuit board 102. When a heat dissipation device 106 (i.e. heat sink or fin) is desired to be secured on the heat generating component 104, a bolt 114 is screwed into the nut 112 through a hole 110a along a direction 120 such that a resilient bracket 110 is secured to the nut 112 and the resilient bracket 110 provides an elastic forces to press the heat dissipation device 106 in contact with a heat conductive material 108. Therefore, heat conduction between the heat dissipation device 106 and the heat generating component 104 can be enhanced.

However, the bolt 114 may not be easily screwed into the nut 112 through the hole 110a because the resilient bracket 110 bends or deforms and the hole 110a doesn't align with the nut 112.

SUMMARY

It is therefore an objective of the present invention to provide a heat dissipation module to meet specific manufacturing procedures.

In accordance with the foregoing and other objectives of the present invention, a heat dissipation module includes a heat dissipation device, a resilient bracket and a cylindrically shaped nut. The heat dissipation device is attached to a heat generating component. The cylindrically shaped nut has an arc surface and two circular surfaces. A screw hole is formed on one of the two circular surfaces and an engraved slot is formed on the arc surface. The resilient bracket is secured to the heat dissipation device at an end and has a U-shaped cutout at an opposite end, wherein the U-shaped cutout has a constricted opening for receiving the cylindrically shaped nut. The U-shaped cutout engages with the engraved slot.

Thus, the heat dissipation module of the present invention can provide different ways to fasten thereof, thereby satisfying specific manufacturing procedures of various small and thin portable electronic devices.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
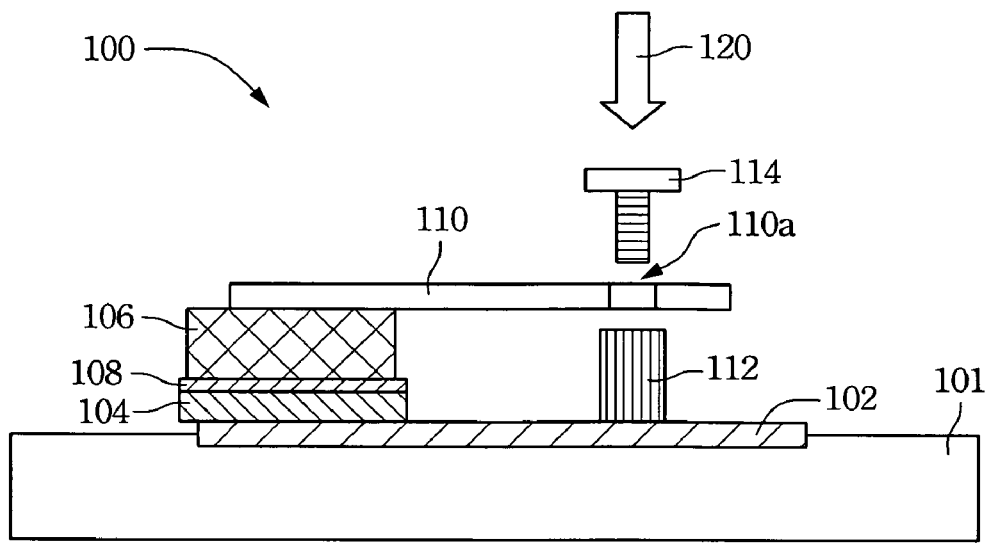
FIG. 1 illustrates a cross-sectional view of a conventional heat dissipation module.

Reference will now be made in detail to the present preferred embodiments of the invention, examples of which are illustrated in the accompanying drawings. Wherever possible, the same reference numbers are used in the drawings and the description to refer to the same or like parts.

Figure 2:
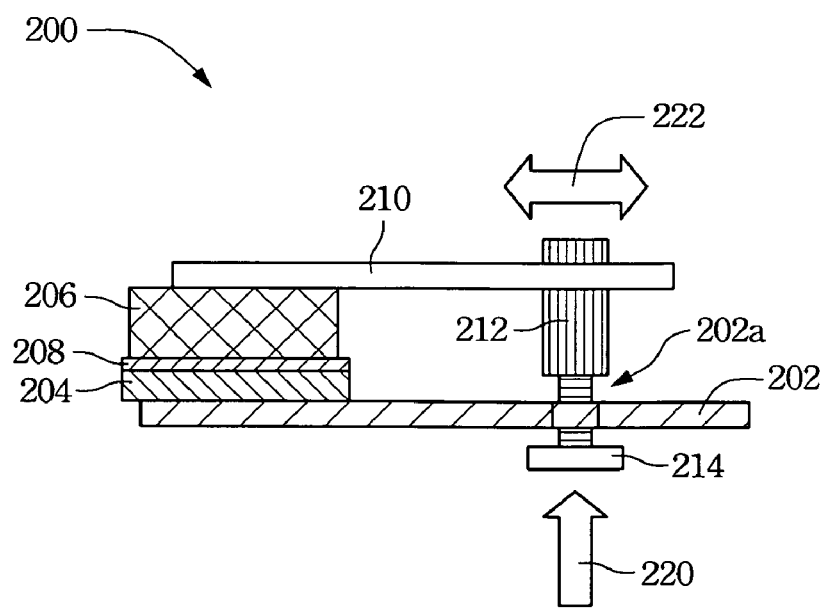
FIG. 2 illustrates a cross-sectional view of a heat dissipation module according to one preferred embodiment of this invention.

FIG. 2 illustrates a cross-sectional view of a heat dissipation module 200 according to one preferred embodiment of this invention. This preferred embodiment is preferably applied to a specific manufacturing procedure, which has a heat dissipation device 206 and a resilient bracket 210 thereof secured on a housing (not illustrated) firstly, and a printed circuit board 202 with a heat generating component 204 is later fastened over the heat dissipation device 206 and the resilient bracket 210. In such cases, the conventional heat dissipation module 100 illustrated in FIG. 1 cannot be applied. In order to satisfy such a manufacturing procedure, a cylindrically shaped nut 212 is initially secured to a resilient bracket 210, and the cylindrically shaped nut 212 can be adjusted in the direction 222 on the resilient bracket 210. A heat conductive material 208 is then disposed on the heat dissipation device 206. Finally, a printed circuit board 202 and a heat generating component 204 thereof is fastened over the heat dissipation device 206 and the resilient bracket 210. A bolt 214 is screwed into a screw hole of the cylindrically shaped nut 212 through a hole 202a of the printed circuit board 202 such that the heat generating component 204 can be in proper contact with the heat conductive material 208. The resilient bracket 210 provides an elastic force to press the heat dissipation device 206 in contact with the heat generating component 204. The heat conductive material 208 disposed between the heat dissipation device 206 and the heat generating component 204 enhances heat conduction between thereof. The heat dissipation device 206 can be a heat sink, a heat fin or a heat fin with a heat pipe.

Figure 3:
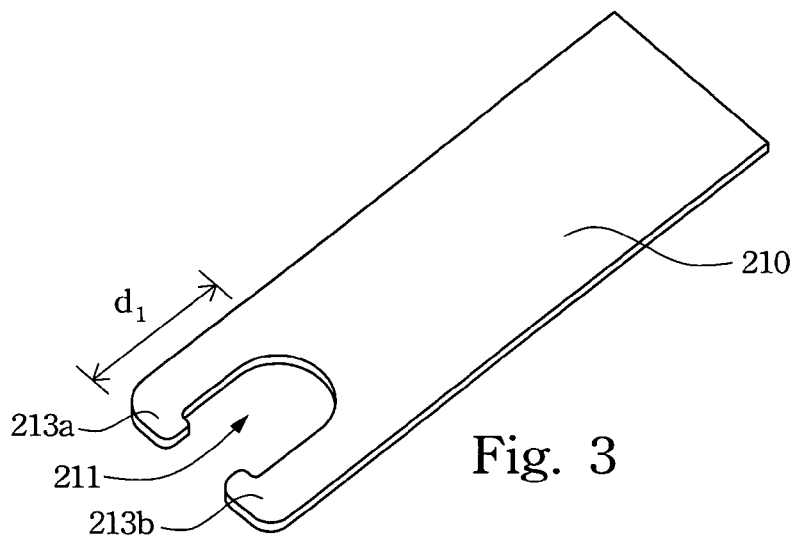
FIG. 3 illustrates a resilient bracket of a heat dissipation module according to one preferred embodiment of this invention.

FIG. 3 illustrates a resilient bracket of a heat dissipation module according to one preferred embodiment of this invention. The resilient bracket 210 has a U-shaped cutout 211 at an end, wherein the U-shaped cutout 211 has a pair of constricted sections 213a and 213b to form a constricted opening to receive the cylindrically shaped nut. The resilient bracket 210 has an opposite end secured to the heat dissipation device 206 (illustrated in FIG. 1).

Figures 4A, 4B:
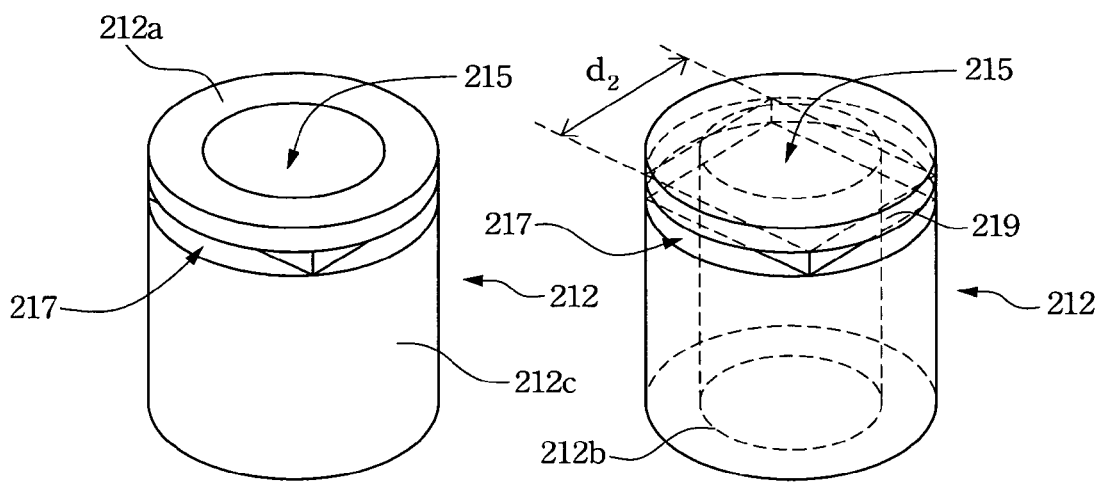
FIG. 4A illustrates a cylindrically shaped nut of a heat dissipation module according to one preferred embodiment of this invention.
FIG. 4B illustrates a cylindrically shaped nut (with inner structure presented in dashed-lines) of a heat dissipation module according to one preferred embodiment of this invention.

FIGS. 4A and 4B both illustrate a cylindrically shaped nut of a heat dissipation module according to one preferred embodiment of this invention, wherein FIG. 4B further illustrates inner designs of the cylindrically shaped nut. The cylindrically shaped nut 212 has a screw hole 215 (has inner screw threads), which can be located on either the circular surface 212a or the circular surface 212b, or located on both of circular surfaces 212a and 212b (penetrating through the cylindrically shaped nut 212). In addition, an engraved slot 217 is formed on an arc surface 212c of the cylindrically shaped nut 212. The cylindrically shaped nut 212 preferably has a square-shaped cross-section (as illustrated in FIG. 4B) at the engraved slot 217, such that the cylindrically shaped nut 212 can be made of less material. The cylindrically shaped nut 212 can be made of copper or copper alloy.

Referring to FIGS. 2, 3 and 4B, the U-shaped cutout 211 has a larger depth $d_1$ than a side length $d_2$ of the square-shaped cross-section of the cylindrically shaped nut 212 such that the cylindrically shaped nut 212 can be adjusted along a direction 222 on the resilient bracket 210.

Figure 5:
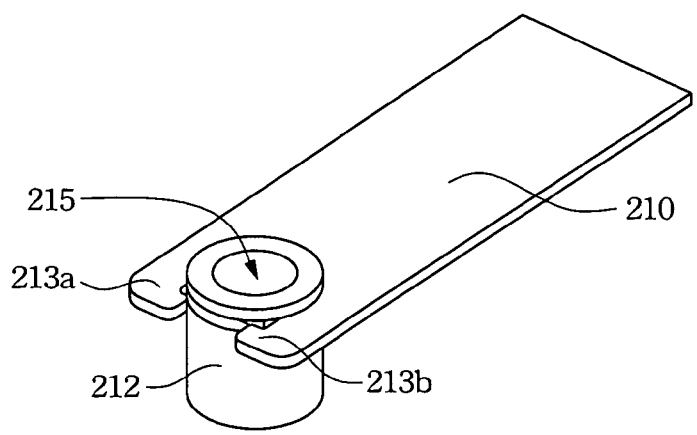
FIG. 5 illustrates an assembly of the cylindrically shaped nut in FIG. 4A and the resilient bracket in FIG. 3.

FIG. 5 illustrates an assembly of the cylindrically shaped nut in FIG. 4A and the resilient bracket in FIG. 3. After the engraved slot 217 of the cylindrically shaped nut 212 and the U-shaped cutout 211 of the resilient bracket 210 engage with each other, the constricted sections 213a and 213b can prevent the cylindrically shaped nut 212 from slipping out of the U-shaped cutout 211. The cylindrically shaped nut 212 can be adjusted on the resilient bracket 210 such that a bolt can be easily screwed into the screw hole 215 when the resilient bracket 210 is bent.

According to preferred embodiments, the heat dissipation module of the present invention can provide different fastening methods, thereby satisfying specific manufacturing procedures of various small and thin portable electronic devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation module, comprising:
    a heat dissipation device, attached to a heat generating component on a printed circuit board;
    a cylindrically shaped nut, having an arc surface and two circular surfaces, the cylindrically shaped nut having a screw hole formed in one of the two circular surfaces that faces the printed circuit board, an engraved slot being formed on the arc surface;
    a bolt, being screwed into the screw hole through a hole in the printed circuit board and securing the cylindrically shaped nut to the printed circuit board; and
    a resilient bracket, having first and second opposite ends, and being secured to the heat dissipation device at the first end and having a U-shaped cutout at the second end opposite to the first end, the U-shaped cutout having a pair of constricted sections at the free ends thereof to constrict an entrance opening thereof, the U-shaped cutout engaging with the engraved slot.

2. The heat dissipation module of claim 1, wherein the cylindrically shaped nut has a square-shaped cross-section at the engraved slot.

3. The heat dissipation module of claim 2, wherein the U-shaped cutout has a larger depth than a side length of the square-shaped cross-section.

4. The heat dissipation module of claim 1, wherein the cylindrically shaped nut is made of copper or copper alloy.

* * * * *

UNITED STATES PATENT AND TRADEMARK OFFICE
CERTIFICATE OF CORRECTION

PATENT NO. : 7,619,890 B2
APPLICATION NO. : 11/477394
DATED : November 17, 2009
INVENTOR(S) : Tseng et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 443 days.

Signed and Sealed this

Twenty-sixth Day of October, 2010

David J. Kappos
*Director of the United States Patent and Trademark Office*